US 7,512,916 B2

(12) United States Patent
Hayashi

(10) Patent No.: US 7,512,916 B2
(45) Date of Patent: Mar. 31, 2009

(54) ELECTROSTATIC DISCHARGE TESTING METHOD AND SEMICONDUCTOR DEVICE FABRICATION METHOD

(75) Inventor: Sachio Hayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 488 days.

(21) Appl. No.: 11/243,355

(22) Filed: Oct. 3, 2005

(65) Prior Publication Data

US 2006/0109596 A1 May 25, 2006

(30) Foreign Application Priority Data

Oct. 7, 2004 (JP) ............................ P2004-294961

(51) Int. Cl.
 G06F 17/50 (2006.01)
 H02H 9/00 (2006.01)
(52) U.S. Cl. .................... 716/5; 716/4; 716/12; 361/56
(58) Field of Classification Search ...................... 716/1, 716/4, 5, 12; 361/56
 See application file for complete search history.

(56) References Cited

U.S. PATENT DOCUMENTS

| 6,086,627 | A * | 7/2000 | Bass et al. ...................... 716/5 |
| 6,385,021 | B1 * | 5/2002 | Takeda et al. .................. 361/56 |
| 6,556,399 | B1 * | 4/2003 | Schoenfeld et al. ........... 361/56 |
| 6,724,603 | B2 * | 4/2004 | Miller et al. ................. 361/111 |
| 6,753,836 | B2 * | 6/2004 | Kwon .......................... 345/87 |
| 7,114,137 | B2 * | 9/2006 | Hayashi .......................... 716/4 |
| 7,257,796 | B2 * | 8/2007 | Miller et al. ................... 716/12 |
| 2006/0193093 | A1 * | 8/2006 | Bertin et al. ................... 361/56 |

FOREIGN PATENT DOCUMENTS

| JP | 10-289260 | 10/1998 |
| JP | 2005-011964 | 1/2005 |

OTHER PUBLICATIONS

Hayashi et al.; "Full-chip analysis method of ESD protection network"; 2004; Quality Electronic Design, 2004. Proceedings. 5th International Symposium on; pp. 439-444.*

Tong et al.; "Active ESD shunt with transistor feedback to reduce latchup susceptibility or false triggering"; Jul. 5-8, 2004; Physical and Failure Analysis of Integrated Circuits, 2004. IPFA 2004. Proceedings of the 11th International Symposium on pp. 89-92.*

(Continued)

Primary Examiner—Helen Rossoshek
(74) Attorney, Agent, or Firm—DLA Piper US LLP

(57) ABSTRACT

A method for determining a layout which passes testing for electrostatic discharge in a semiconductor device, includes extracting an electrostatic discharge protection network including pads, nets and protective elements; setting start pads and end pads in the electrostatic discharge protection network; finding inter-pad voltages between the start pads and the end pads and electrostatic discharge current paths from the start pads to the end pads; grouping together the electrostatic discharge current paths in the same order; calculating estimated values of electrostatic discharge withstand voltages between the start pads and the end pads and groups to which the start pads and the end pads belong using a negative correlation between the inter-pad voltages and corresponding electrostatic withstand voltages; and determining whether the layout passes testing regarding electrostatic discharge.

20 Claims, 19 Drawing Sheets

OTHER PUBLICATIONS

NA81123427; "Layout for Lateral NPN Protective Device Enhancing Chip Wireability"; Dec. 1981; IBM Technical Disclosure Bulletin; vol. No. 24; Issue No. 7A; p. No. 3427-3430 ☐☐.*

U.S. Appl. No. 10/890,025, filed Jul. 2004, Sachio.

Ngan, et al., "Automatic Layout Based Verification Of Electrostatic Discharge Paths," EOS/ESD Symposium, pp. 2A.4.1-2A.4.6, Jan. 1996.

* cited by examiner

INTER-PAD VOLTAGE INFORMATION

| <START PAD> | <END PAD> | <INTER-PAD VOLTAGE> (V) |
|---|---|---|
| PAD1 | PAD2 | 2.345 |
| PAD1 | PAD3 | 10.894 |
| PAD1 | PAD4 | 5.431 |
| PAD1 | PAD5 | 7.451 |
| ........ | ........ | ........ |

EXEMPLARY DESCRIPTION OF ESD
CURRENT PATH INFORMATION

```
PAD1 IOCELL1
 VDD2 1.231
  GGNMOS1 IOCELL1 6.341
 VSS2 0.659
  DIODE1 IOCELL2 1.213
 VSS1 0.125
  DIODE2 1.679
 SIG1 2.123
PAD2 IOCELL2
```

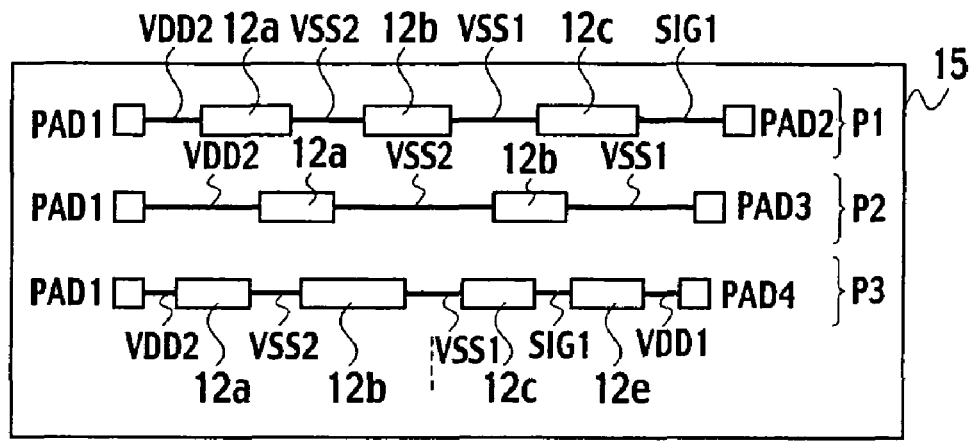

FIG. 7

FIG. 8
(EXEMPLARY GROUPING METHOD 1)

| | |
|---|---|
| NET NAME | |
| PROTECTIVE ELEMENT NAME | |
| NET NAME | |
| PROTECTIVE ELEMENT NAME | |
| NET NAME | |
| | |

FIG. 9
(EXEMPLARY GROUPING METHOD 2)

| | |
|---|---|
| | NAME OF I/O CELL CONNECTED TO THE PAD |
| NET NAME | |
| PROTECTIVE ELEMENT NAME | NAME OF I/O CELL TO WHICH THE PROTECTIVE ELEMENT BELONGS |
| NET NAME | |
| PROTECTIVE ELEMENT NAME | NAME OF I/O CELL TO WHICH THE PROTECTIVE ELEMENT BELONGS |
| NET NAME | |
| | NAME OF I/O CELL CONNECTED TO THE PAD |

FIG. 17
| <START PAD> | <END PAD> | INTER-PAD VOLTAGE (CALCULATED VALUE) | ESD WITHSTAND VOLTAGE (ACTUAL MEASUREMENT) |
|---|---|---|---|
| PAD11 | PAD12 | 3.346 | VB12 |
| PAD11 | PAD13 | 9.895 | VB13 |
| PAD11 | PAD14 | 6.432 | VB14 |
| PAD11 | PAD15 | 6.452 | VB15 |
| ........ | ........ | ........ | ........ |
FIG. 18
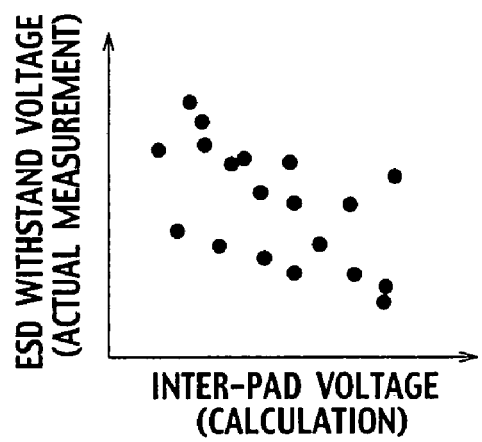
FIG. 19
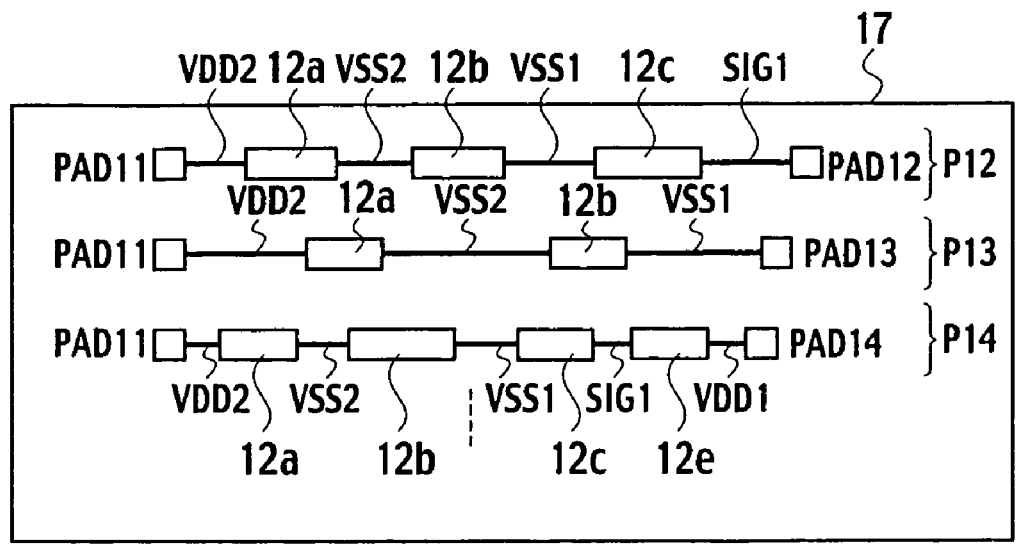

ELECTROSTATIC DISCHARGE TESTING METHOD AND SEMICONDUCTOR DEVICE FABRICATION METHOD

CROSS REFERENCE TO RELATED APPLICATIONS AND INCORPORATION BY REFERENCE

This application is based upon and claims the benefit of priority from the prior Japanese Patent Applications No. P2004-294961, filed on Oct. 7, 2004; the entire contents of which are incorporated herein by reference.

BACKGROUND OF THE INVENTION

1. Field of the Invention

The present invention relates to a testing method for electrostatic discharge of a semiconductor device.

2. Description of the Related Art

A testing method of earlier technology for electrostatic discharge (ESD) of a semiconductor device includes extracting an ESD protection network from a layout of the semiconductor device, carrying out ESD current path analysis for a section of the network between two arbitrary pads using a shortest path search method to calculate an inter-pad voltage when an ESD current flows through an ESD current path, and determining the magnitude of an ESD withstand voltage based on the inter-pad voltage.

Generally, the risk of an ESD breakdown is high when the inter-pad voltage is high, and it is low when the inter-pad voltage is low. Accordingly, an ESD withstand voltage will be low when the inter-pad voltage is high, and it will be high when the inter-pad voltage is low. However, there has been a case where the ESD withstand voltage between pads indicating a small inter-pad voltage was low, as calculated by the above-described method. Moreover, there has also been a case where the magnitude of the ESD withstand voltage, based on only the inter-pad voltage as calculated by the above-described method, was erroneously determined.

An ESD testing method is carried out by extracting path information between two terminals and element information along the path from old and updated circuitry data, respectively, comparing the extracted information from the updated circuitry data to that of the old circuitry data, and determining whether the semiconductor device passes the ESD testing.

The parasitic resistance of interconnects connecting between protective elements greatly affects the ESD withstand voltage. However, according to this testing method, since ESD testing is carried out based on circuitry data, parasitic resistance is disregarded. Furthermore, with this testing method, the magnitude of an ESD withstand voltage is determined by only comparing the dimension of a protective element, along a path between two terminals, to the dimension of a protective element along a similar path. Therefore, this method will provide unsatisfactory accuracy.

Moreover, according to yet another ESD testing method, circuit simulation is executed for a section between two pads in the ESD protection network extracted from the layout. Although the accuracy of this testing method is good, processing takes time, and is therefore virtually impossible to be applied to sections between all paired pads. Furthermore, there is a problem in that testing different combinations of all pads, even in the ESD withstand voltage test, requires an extensive amount of processing time, thereby being virtually impossible to use effectively.

BRIEF SUMMARY OF THE INVENTION

An aspect of the present invention inheres in a method for determining a layout which passes testing for electrostatic discharge in a semiconductor device, including: extracting an electrostatic discharge protection network including pads, nets and protective elements from the layout of the semiconductor device; setting start pads and end pads from the pads in the electrostatic discharge protection network; finding inter-pad voltages between the start pads and the end pads and electrostatic discharge current paths along which the nets and the protective elements are arranged in order from the start pads to the end pads; grouping together the electrostatic discharge current paths along with the nets and the protective elements arranged in the same order; calculating estimated values of electrostatic discharge withstand voltages between the start pads and the end pads, based on the inter-pad voltages between the start pads and the end pads and groups to which the start pads and the end pads belong using a negative correlation between the inter-pad voltages and corresponding electrostatic withstand voltages for each group; and determining whether the layout passes testing for electrostatic discharge, based on the estimated values.

Another aspect of the present invention inheres in a method for determining a layout which passes testing for electrostatic discharge in a semiconductor device, including: extracting an electrostatic discharge protection network including pads, nets and protective elements from the layout of the semiconductor device; setting start pads and end pads from the pads in the electrostatic discharge protection network; finding inter-pad voltages with low accuracy between the start pads and the end pads and electrostatic discharge current paths along which the nets and the protective elements are arranged in order from the start pads to the end pads; grouping together electrostatic discharge current paths having the nets and the protective elements arranged in the same order; extracting a start pad and an end pad having the highest inter-pad voltage found with low accuracy for each group; finding once again, with high accuracy, through circuit simulation for each group, the inter-pad voltages between the start pad and the end pad having the highest inter-pad voltage found with low accuracy; and determining whether the layout passes testing for electrostatic discharge, based on the inter-pad voltages found with high accuracy.

Still another aspect of the present invention inheres in a method for determining a layout which passes testing for electrostatic discharge in a semiconductor device, including: extracting an electrostatic discharge protection network comprising pads, nets and protective elements from the layout of the semiconductor device; setting start pads and end pads from the pads in the electrostatic discharge protection network; finding inter-pad voltages between the start pads and the end pads and electrostatic discharge current paths along which the nets and the protective elements are arranged in order from the start pads to the end pads; grouping together electrostatic discharge current paths along which the nets and the protective elements are arranged in the same order; extracting for each group a start pad and an end pad having the highest inter-pad voltage; finding actual measurements of electrostatic discharge withstand voltages between the start pad and the end pad having the highest inter-pad voltage for each group; and determining whether the layout passes testing for electrostatic discharge, based on the actual measurements.

BRIEF DESCRIPTION OF THE DRAWINGS

FIG. 7 shows an ESD current path information set for the ESD testing target semiconductor device;

FIG. 8 shows an example 1 of criteria for grouping;

FIG. 9 shows an example 2 of criteria for grouping;

FIG. 17 is a table of inter-pad voltages (calculated values) and ESD withstand voltages (actual measurements) of a previously fabricated group of semiconductor devices;

FIG. 18 is a graph of ESD withstand voltages (actual measurements) vs. inter-pad voltages (calculated values) of the previously fabricated group of semiconductor devices;

FIG. 19 shows an ESD current path set (calculated values) of the previously fabricated group of semiconductor devices;

DETAILED DESCRIPTION OF THE INVENTION

Figure 1:
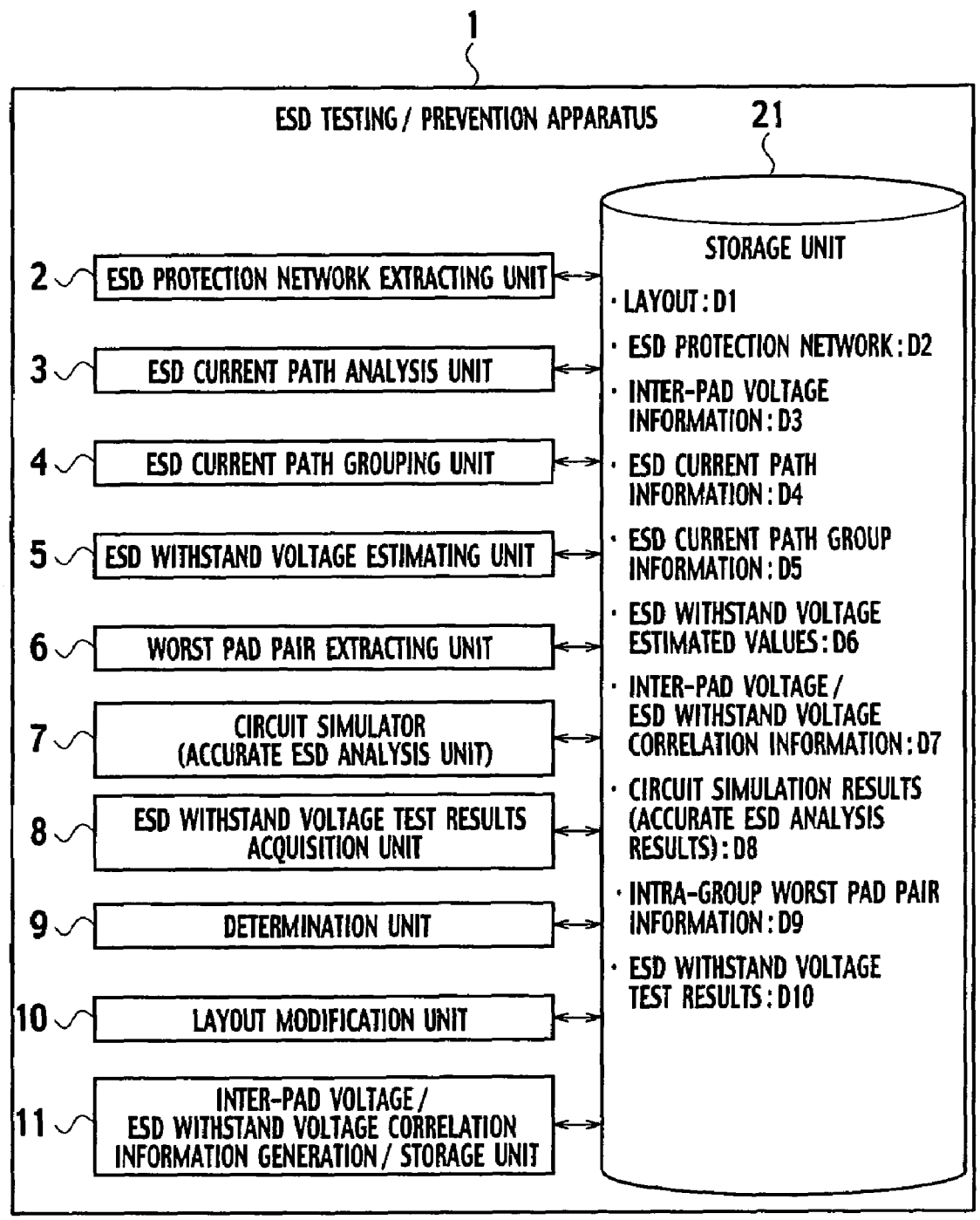
FIG. 1 shows a layout of an ESD testing/prevention apparatus of a first embodiment.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

As shown in FIG. 1, an ESD testing/prevention apparatus 1 according to the first embodiment includes an ESD protection network extracting unit 2, an ESD current path analysis unit 3, an ESD current path grouping unit 4, an ESD withstand voltage estimating unit 5, a worst pad pair extracting unit 6, a circuit simulator (accurate ESD analysis unit) 7, an ESD withstand voltage test results acquisition unit 8, a determination unit 9, a layout modification unit 10, an inter-pad voltage/ ESD withstand voltage correlation information generation/ storage unit 11, and a storage unit 21. The storage unit 21 stores a layout D1, an ESD protection network D2, inter-pad voltage information D3, ESD current path information D4, ESD current path group information D5, ESD withstand voltage estimated values D6, inter-pad voltage/ESD withstand voltage correlation information D7, circuit simulation results (accurate ESD analysis results) D8, intra-group worst pad pair information D9, and ESD withstand voltage test results D10. The ESD testing/protection apparatus 1 may be a computer, or it may be implemented by executing a procedure written in a program of a computer.

Figure 2:
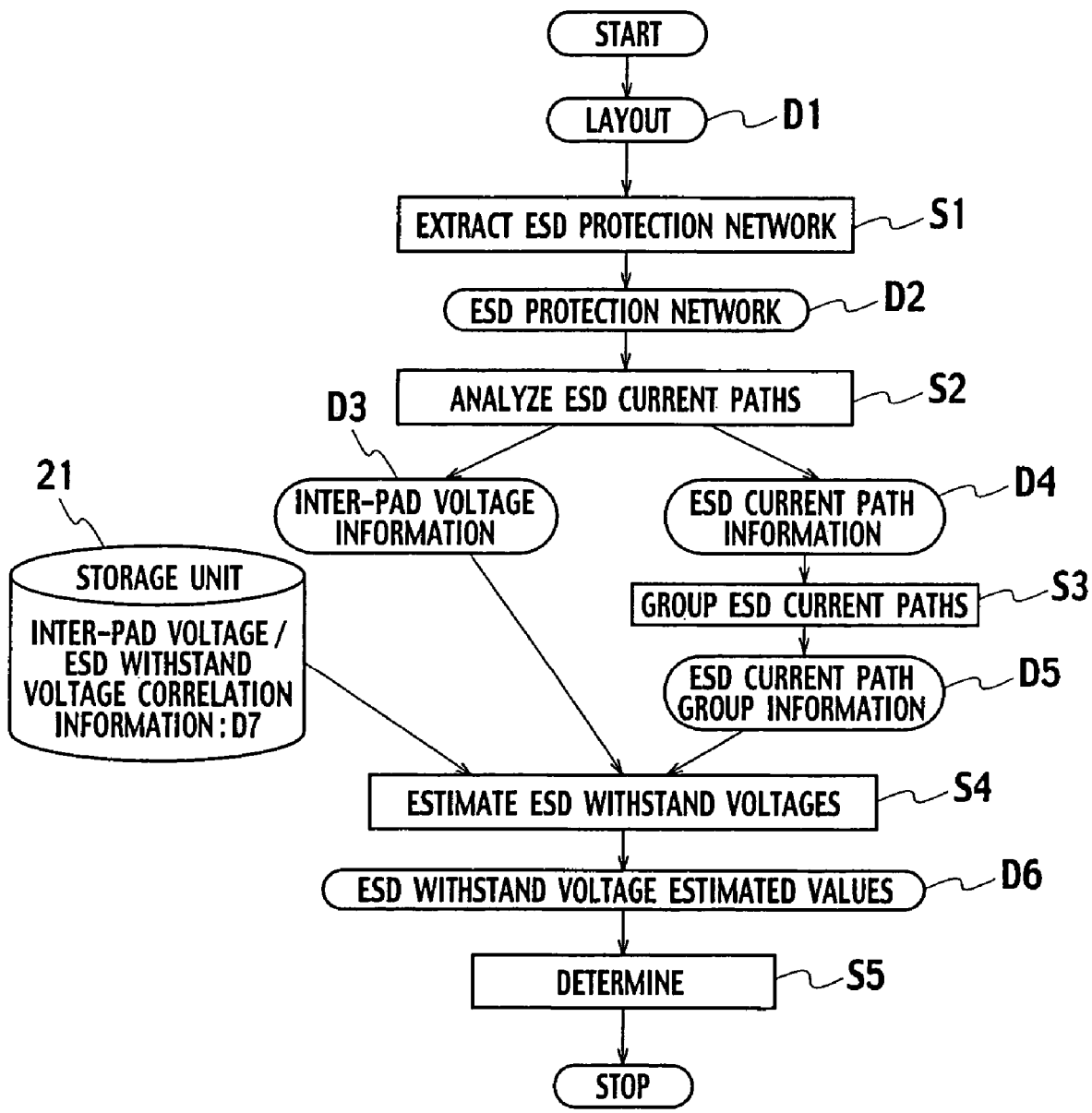
FIG. 2 is a flowchart according to an ESD testing method of the first embodiment.
Figures 3, 4:
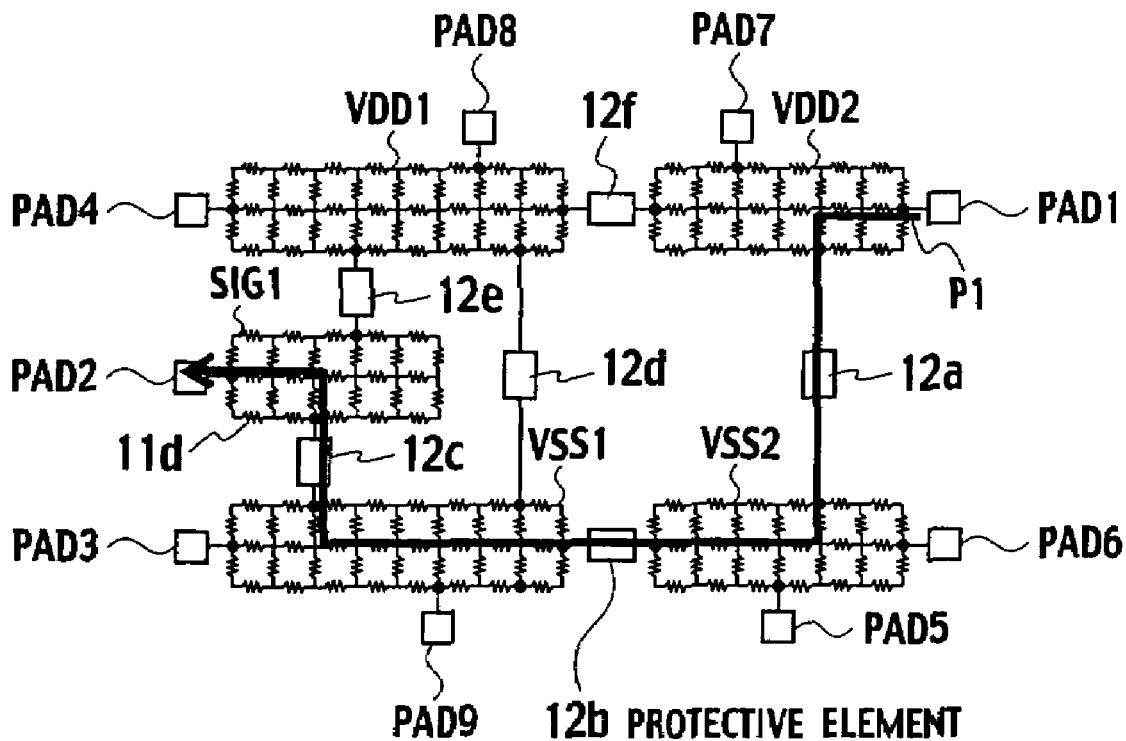
FIG. 3 is a schematic diagram of an ESD protection network and ESD current paths of an ESD testing target semiconductor device.
FIG. 4 is a diagram showing a data structure of inter-pad voltage information.

An ESD testing method according to the first embodiment may be implemented by the ESD testing/prevention apparatus of FIG. 1. As shown in FIG. 2, with the ESD testing method, in step S1, the ESD protection network extracting unit 2 firstly extracts the ESD protection network D2, which includes pads, nets and protective elements, from the layout D1 of a semiconductor device. More specifically, the ESD prevention network D2 as shown in FIG. 3 is generated. The ESD prevention network D2 comprises pads PAD1 through PAD9, nets VDD1, VDD2, VSS1, VSS2, and SIG1, and protective elements 12a through 12f.

Next, in step S2, the current path analysis unit 3 sets a start pad PAD1 and an end pad PAD2 from the pads PAD1 through PAD9 of the ESD protection network D2. In addition, the current path analysis unit 3 finds an ESD current path P1, which extends from the start pad PAD1 to the end pad PAD2 and configures the inter-pad voltage information D3 and the ESD current path information D4. A paired start pad and end pad may be an arbitrary combination taken from all the pads PAD1 through PAD9. Alternatively, a paired set of pads may be determined one by one, resulting in comprehensively covering all paired sets.

As shown in FIG. 4, the inter-pad voltage information D3 includes an inter-pad voltage of 2.345 V between the start pad PAD1 and the end pad PAD2. Similarly, the inter-pad voltage information D3 includes an inter-pad voltage of 10.894 V between the start pad PAD1 and an end pad PAD3, an inter-pad voltage of 5.431 V between the start pad PAD1 and an end pad PAD4, and an inter-pad voltage of 7.451 V between the start pad PAD1 and an end pad PAD5.

Figures 5, 6:
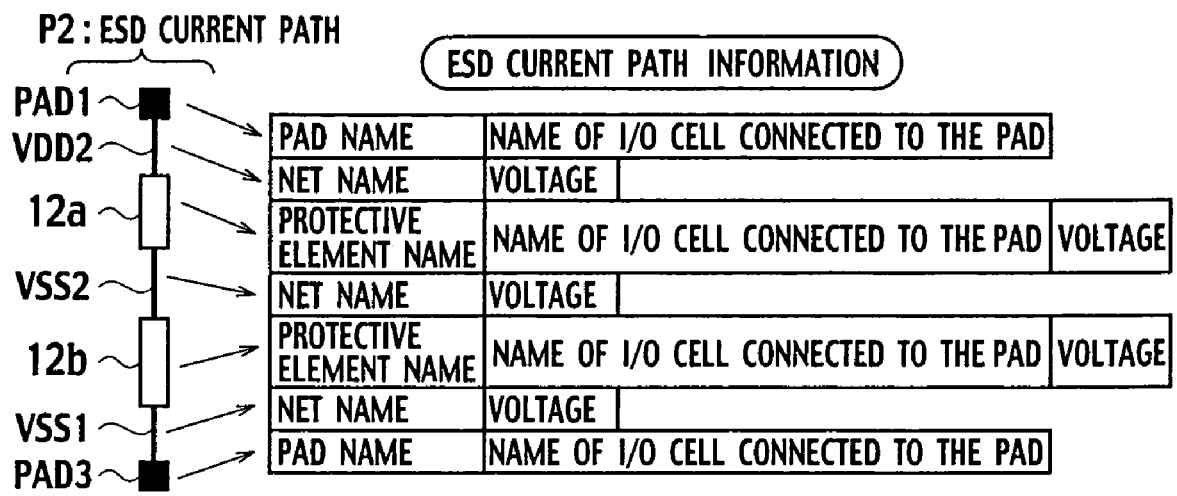
FIG. 5 is a diagram showing a data structure of ESD current path information.
FIG. 6 shows an exemplary description of ESD current path information.

As shown in FIG. 5, the ESD current path information D4 includes an ESD current path P2. Along the ESD current path P2, pad names of the start pad PAD1 and the end pad PAD3, net names of the net VDD2, VSS2, and VSS1 in order from the start pad PAD1 to the end pad PAD2, and protective element names of the protective elements 12a and 12b are listed in order. The ESD current path P2 also includes names of respective I/O cells (i.e., an input cell and an output cell), which are connected to the start pad and the end pad and are arranged in the same order as that of the pad names. Voltages are written along the ESD current path P2 in the same order as that of the net names. I/O cell names and voltages, to which the protective elements belong, are written along the ESD current path P2 in the same order as that of the protective element names. In this manner, information regarding pads, nets, and protective elements passing through the ESD current path P2 is written in the ESD current path information D4 in the order of passing therethrough.

As shown in FIG. 6, 'PAD1' is written as the pad name of the start pad PAD1 in the ESD current path information of the ESD current path P1 in FIG. 3. 'IOCELL1' is written as the name of the I/O cell connected to the start pad PAD1 in the same order of 'PAD1'.

In the next order to 'PAD1', 'VDD2' is written as the net name of the net VDD2 following the start pad PAD1 along the ESD current path P1. '1.231' is written as a voltage (V) generated in the net VDD2 in the same order of 'VDD2'.

In the next order to 'VDD2', 'GGNMOS1' is written as the protective element name of the protective element 12a following the net VDD2 along the ESD current path P1. 'IOCELL1' is written as the name of the I/O cell to which the protective element 12a belongs, in the same order of 'GGNMOS1'. '6.341' is written as a voltage generating in the protective element 12a, in the same order of 'GGNMOS1'.

In the next order to 'GGNMOS1', 'VSS2' is written as the net name of the net VSS2 following the protective element 12a along the ESD current path P1. '0.659' is written as a voltage generated in the net VSS2 in the same order of 'VSS2'.

In the next order to 'VDD2', 'DIODE1' is written as the protective element name of the protective element 12b following the net VSS2 along the ESD current path P1. 'IOCELL2' is written as the name of the I/O cell belonging to the protective element 12b in the same order of 'DIODE1'.

'1.213' is written as a voltage generated in the protective element 12b in the same order of 'DIODE1'.

In the next order to 'DIODE1', 'VSS1' is written as the net name of the net VSS1 following the protective element 12b along the ESD current path P1. '0.125' is written as a voltage generated in the net VSS1 in the same order of 'VSS1'.

In the next order to 'VDD1', 'DIODE2' is written as the protective element name of a protective element 12c following the net VSS1 along the ESD current path P1. '1.679' is written as a voltage generating in the protective element 12c, in the same order of 'DIODE2'.

In the next order to 'DIODE2', 'SIG1' is written as the net name of the net SIG1 following the protective element 12c along the ESD current path P1. '2.123' is written as a voltage generated in the net SIG1 in the same order of 'SIG1'.

In the next order to 'SIG1', 'PAD2' is written as the pad name of the PAD2 following the net SIG1 along the ESD current path P1. 'IOCELL2' is written as the name of the I/O cell connected to the end pad PAD2, in the same order of 'PAD2'.

As shown in FIG. 7, multiple ESD current paths P1 through P3 are generated. Respective ESD current paths P1 through P3 include the ESD current path information D4. The multiple ESD current paths P1 through P3 configure an ESD current path set 15.

In step S3 of FIG. 2, The ESD current path grouping unit 4 divides the ESD current paths P1 through P3 or components of the ESD current path set 15 into groups according to a grouping method.

As shown in FIG. 8, according to a grouping method, a group for each of the ESD current paths P1 through P3, each having the ESD current path information D4 including the same sequence of net names and protective element names, is formed. In other words, a criterion for determining whether or not the ESD current paths P1 through P3 are in the same group is whether the ESD current paths have the same sequence of net names and protective element names in the ESD current path information D4. ESD current paths in the same group hold significant promise of a negative correlation between inter-pad voltages and ESD withstand voltages.

As shown in FIG. 9, according to a grouping method, a group may be formed for each of the ESD current paths P1 through P3, each having the ESD current path information D4 including the same sequence of net names, protective element names, names of I/O cells connected to pads, and names of I/O cells to which protective elements belong. In other words, the criterion for determining whether or not the ESD current paths P1 through P3 are in the same group is whether the ESD current paths have the same sequence of net names, protective element names, names of I/O cells connected to pads, and names of I/O cells to which protective elements belong in the ESD current path information D4.

Figure 10:
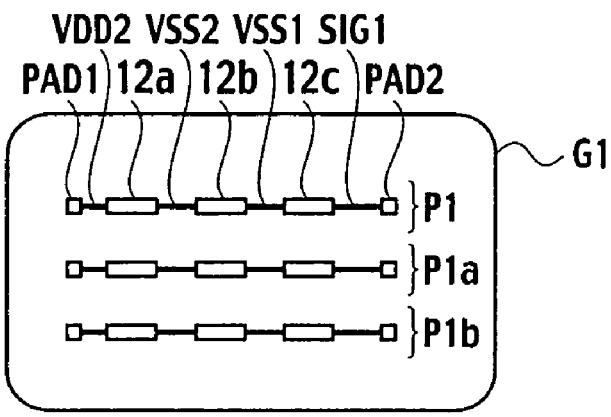
FIG. 10 shows a structure of a group G1 for the ESD testing target semiconductor device.

A group G1 is formed, as shown in FIG. 10. The group G1 includes ESD current paths P1, P1a, and P1b. The respective ESD current paths P1, P1a, and P1b have the sequence of net names and protective element names: VDD2, 12a, VSS2, 12b, VSS1, 12c, and SIG1, in this written order.

Figure 11:
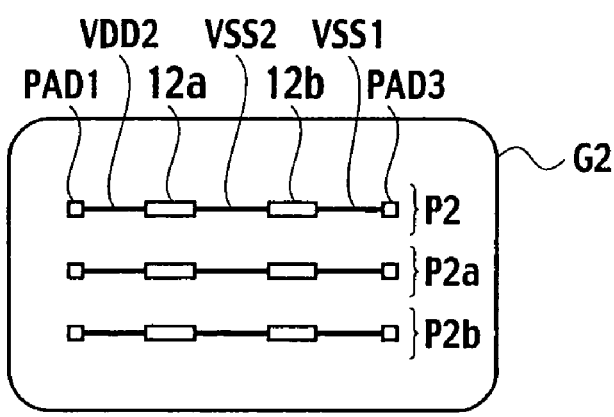
FIG. 11 shows a structure of a group G2 for the ESD testing target semiconductor device.

A group G2 is formed, as shown in FIG. 11. The group G2 includes ESD current paths P2, P2a, and P2b. The respective ESD current paths P2, P2a, and P2b have the same sequence of net names and protective element names: VDD2, 12a, VSS2, 12b, and VSS1 in this written order.

Figure 12:
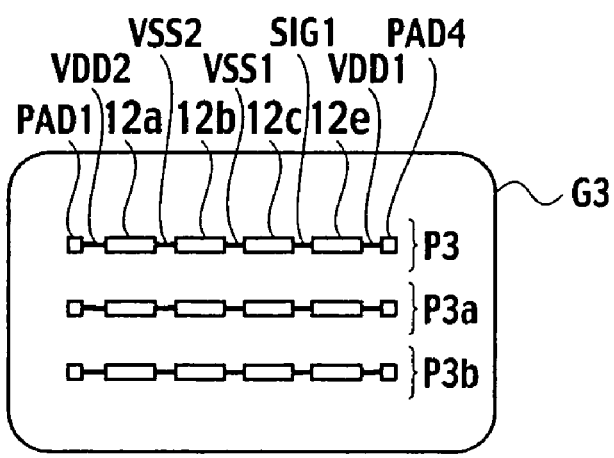
FIG. 12 shows a structure of a group G3 for the ESD testing target semiconductor device.

A group G3 is formed, as shown in FIG. 12. The group G3 includes ESD current paths P3, P3a, and P3b. The respective ESD current paths P3, P3a, and P3b have the same sequence of net names and protective element names: VDD2, 12a, VSS2, 12b, VSS1, 12c, SIG1, 12e, and VDD1, in this written order.

In addition, as shown in FIGS. 10 through 12, the set 15 of the ESD current paths P1 through P3 in FIG. 7 is divided into the groups G1 through G3.

Figure 13:
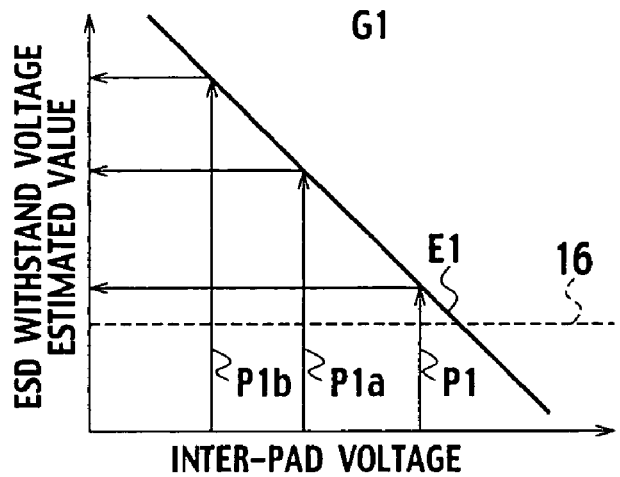
FIG. 13 is a graph showing a correlation equation for the group G1.
Figure 14:
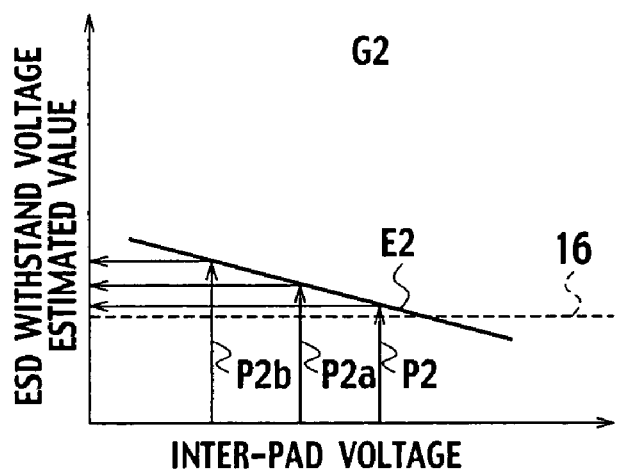
FIG. 14 is a graph showing a correlation equation for the group G2.
Figure 15:
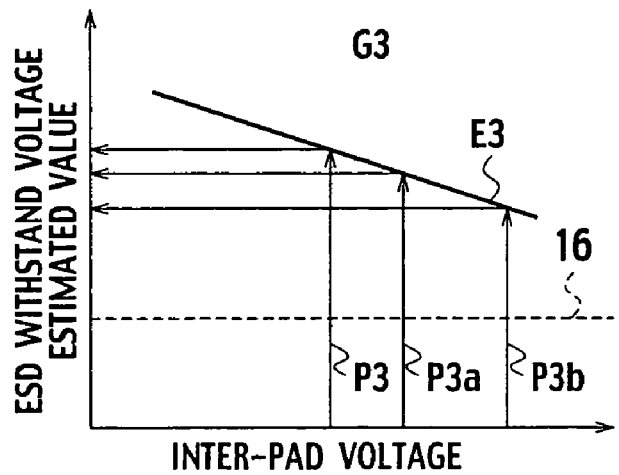
FIG. 15 is a graph showing a correlation equation for the group G3.

As shown in FIGS. 13 through 15, the ESD inter-pad voltage/withstand voltage correlation information D7 includes results of analyzing inter-pad voltage between a start pad and an end pad of an ESD current path in a previously fabricated semiconductor device and data of actual measurements of ESD withstand voltages, for each of the respective ESD current path groups G1 through G3. Correlation equations E1 through E3, indicating respective negative correlations between inter-pad voltage and ESD withstand voltage, are calculated and included in the ESD inter-pad voltage/withstand voltage correlation information D7.

In step S4 of FIG. 2, the ESD withstand voltage estimating unit 5 uses the inter-pad voltages of the ESD current paths P1 through P3 from the inter-pad voltage information D3 and the groups G1 through G3 to which the ESD current paths P1 through P3 belong, from the ESD current path group information D5, to calculate estimated values D6 of ESD withstand voltages for the respective ESD current paths P1 through P3, based on the correlation equations E1 through E3 for the respective groups G1 through G3, as shown in FIGS. 13 through 15.

In step S5 of FIG. 2, the determination unit 9 determines based on the estimated values D6, whether the semiconductor device layout passes the ESD testing. For example, as shown in FIGS. 13 through 15, a threshold value 16 for the ESD withstand voltage estimated values D6 is predetermined. In the determination, if all of the ESD withstand voltage estimated values D6 are greater than the threshold value 16, as shown in FIGS. 13 through 15, it may be determined that the ESD countermeasure for the semiconductor device is sufficient. On the other hand, if one of the ESD withstand voltage estimated values D6 is less than the threshold value 16, it is determined that the ESD countermeasure for the semiconductor device is insufficient.

As such, the ESD withstand voltage estimated values D6 are calculated, based on the inter-pad voltages in the inter-pad voltage information D3, using the correlation equations E1 through E3 in the inter-pad voltage/ESD withstand voltage correlation information D7 provided for the respective groups G1 through G3 of the ESD current paths P1 through P3, and highly accurate ESD withstand voltage estimated values are determined by consideration of the ESD withstand voltage measured data. Thus, a risk of erroneous determination of not only the section between pads, but also the entire semiconductor device passing the ESD testing, is reduced.

The ESD testing method may be implemented as a computer executable ESD testing program. Execution of the ESD testing program by a computer implements the ESD testing method.

Note that the correlation equations E1 through E3 in the inter-pad voltage/ESD withstand voltage correlation information D7 may be obtained using the inter-pad voltage/ESD withstand voltage correlation information generation/storage unit 11 of FIG. 1.

Figure 16:
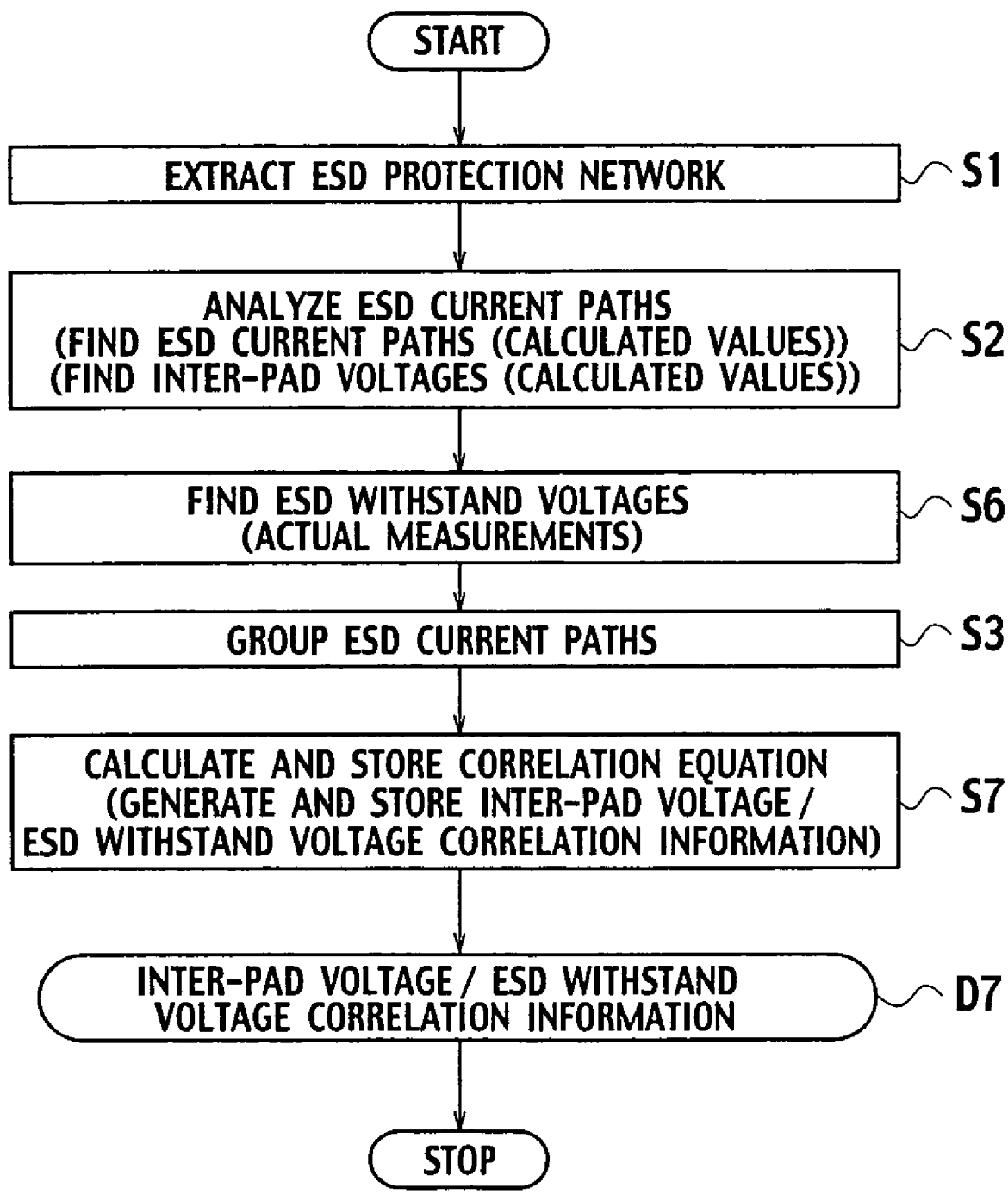
FIG. 16 is a flowchart according to a generation/storage method for inter-pad voltage/ESD withstand voltage correlation information.

Firstly, as shown in FIG. 16, in step S1, extraction of an ESD protection network from the layout of the previously fabricated semiconductor device is carried out in the same manner as in the step S1 of FIG. 2. In step S2, ESD current path analysis is carried out for the extracted ESD protection network, as in the step S1 of FIG. 2. This procedure acquires an ESD current path and inter-pad voltages. Next, ESD withstand voltages of the previously fabricated semiconductor device are measured. In step S6, actual measurements of ESD withstand voltages are taken. As described above, as shown in FIG. 17, the inter-pad voltages and the actual measurements of ESD withstand voltages are stored so as to be retrievable, based on the start pad and the end pad of an ESD current path. As shown in FIG. 18, a distribution graph for ESD current paths may be shown two dimensionally with inter-pad voltages on the X-axis and actual measurements of ESD withstand voltages on the Y-axis. It is difficult to find a clear negative correlation between the inter-pad voltages and actual measurements of ESD withstand voltages in this distribution graph. As shown in FIG. 19, acquired ESD current paths P12 through P14 configure an ESD current path information set. The ESD current path P12 takes a route passing through a start pad PAD11, a net VDD2, a protective element 12a, a net VSS2, a protective element 12b, a net VSS1, a protective element 12c, a net SIG1, and an end pad PAD12 in this written order. The ESD current path P13 takes a route passing through the start pad PAD11, the net VDD2, the protective element 12a, the net VSS2, the protective element 12b, the net VSS1, and an end pad PAD13 in this written order. The ESD current path P14 takes a route passing through the start pad PAD11, the net VDD2, the protective element 12a, the net VSS2, the protective element 12b, the net VSS1, a protective element 12c, the net SIG1, a protective element 12e, a net VDD1, and an end pad PAD14 in this written order.

In step S3 of FIG. 16, dividing the ESD current paths P12 through P14 into groups is carried out as in the step S3 of FIG. 2. Specifically, according to the grouping method of FIGS. 8 and 9, processing in the step S3 of FIG. 16 is the same as that in the step S3 of FIG. 2.

Figure 20:
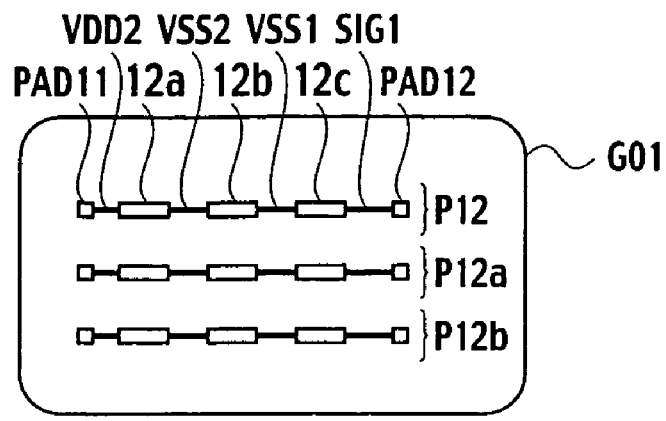
FIG. 20 shows a structure of a group G1 according to the previously fabricated group of semiconductor device.

A group G01 is formed as shown in FIG. 20. The group G01 includes ESD current paths P12, P12a, and P12b. The respective ESD current paths P12, P12a, and P12b have the same sequence of net names and protective element names: VDD2, 12a, VSS2, 12b, VSS1, 12c, and SIG1 in this written order.

Figure 21:
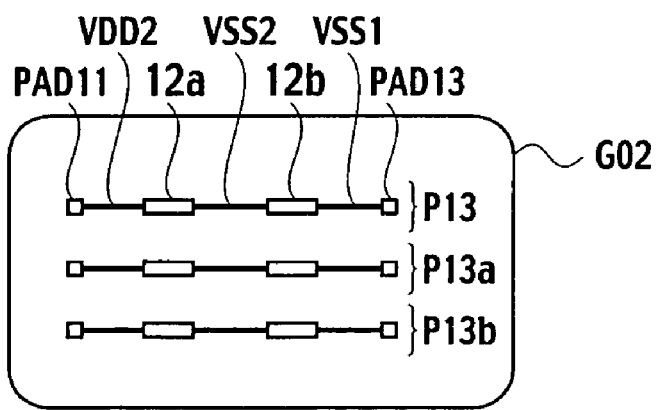
FIG. 21 shows a structure of a group G2 according to the previously fabricated group of semiconductor device.

A group G02 is formed as shown in FIG. 21. The group G02 includes ESD current paths P13, P13a, and P13b. The respective ESD current paths P13, P13a, and P13b have the same sequence of net names and protective element names: VDD2, 12a, VSS2, 12b, and VSS1 in this written order.

Figure 22:
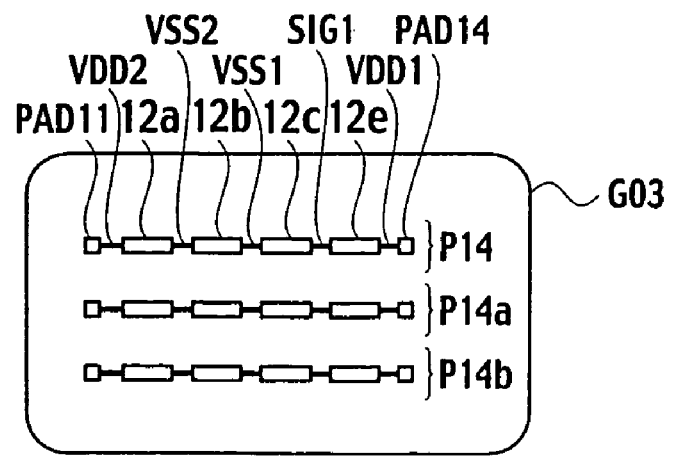
FIG. 22 shows a structure of a group G3 according to the previously fabricated group of semiconductor device.

A group G03 is formed as shown in FIG. 22. The group G03 includes ESD current paths P14, P14a, and P14b. The respective ESD current paths P14, P14a, and P14b have the same sequence of net names and protective element names: VDD2, 12a, VSS2, 12b, VSS1, 12c, SIG1, 12e, and VDD1 in this written order.

In addition, as shown in FIGS. 20 through 22, a set 17 of the ESD current paths P12 through P14 is divided into the groups G01 through G03.

In step S7 of FIG. 16, the correlation equations E1 through E3 in the inter-pad voltage/ESD withstand voltage correlation information D7 are generated and stored for the respective groups G01 through G03.

Figure 23:
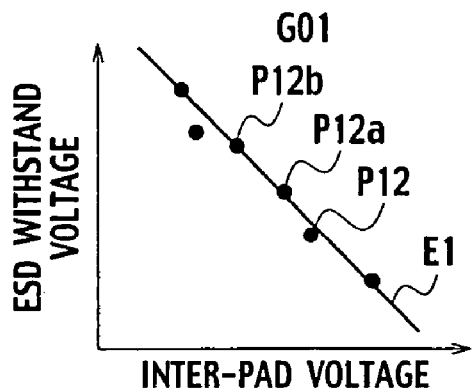
FIG. 23 is a graph showing a correlation equation for the group G1.

As shown in FIG. 23, a distribution graph for the ESD current paths P12, P12a, and P12b may be shown two dimensionally with inter-pad voltages on the X-axis and actual measurements of ESD withstand voltages on the Y-axis. The linear correlation equation E1 is calculated from this distribution graph using the least-squares method. The correlation equation E1 indicates a clear negative correlation between inter-pad voltages and corresponding actual measurements of ESD withstand voltages. The group G01 corresponds to the group G1, resulting from calculating estimated ESD withstand voltages in the step S4 of FIG. 2.

Figure 24:
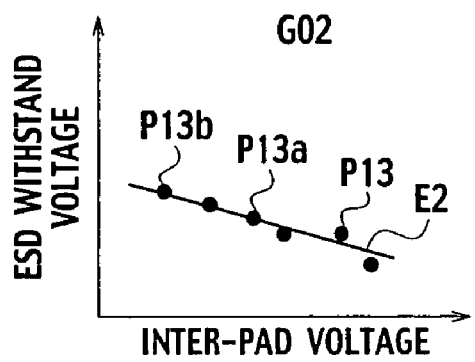
FIG. 24 is a graph showing a correlation equation for the group G2.

As shown in FIG. 24, a distribution graph for the ESD current paths P13, P13a, and P13b, belonging to the group G02, may be shown two dimensionally with inter-pad voltages on the X-axis and actual measurements of ESD withstand voltages on the Y-axis. The linear correlation equation E2 is calculated from this distribution graph using the least-squares method. The correlation equation E2 indicates a clear negative correlation between inter-pad voltages and corresponding actual measurements of ESD withstand voltages. The group G02 corresponds to the group G2, resulting from calculating estimated ESD withstand voltages in the step S4 of FIG. 2.

Figure 25:
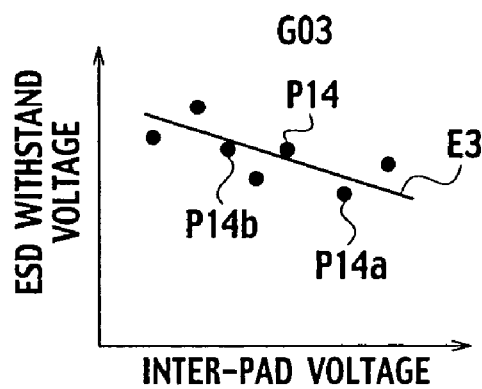
FIG. 25 is a graph showing a correlation equation for the group G3.

As shown in FIG. 25, a distribution graph for the ESD current paths P14, P14a, and P14b, belonging to the group G03, may be shown two dimensionally with inter-pad voltages on the X-axis and actual measurements of ESD withstand voltages on the Y-axis. The linear correlation equation E3 is calculated from this distribution graph using the least-squares method. The correlation equation E3 indicates a clear negative correlation between inter-pad voltages and corresponding actual measurements of ESD withstand voltages. The group G03 corresponds to the group G3, resulting from calculating estimated ESD withstand voltages in the step S4 of FIG. 2.

Figure 26:
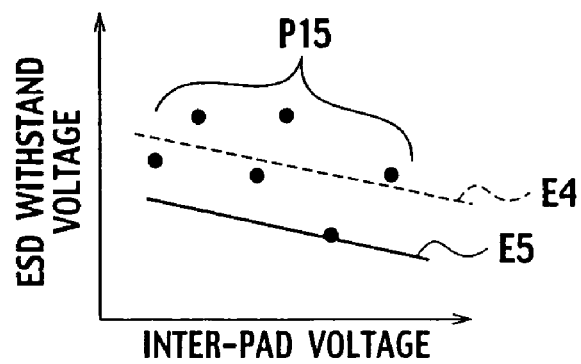
FIG. 26 is a graph describing a setting method for a correlation equation.

Note that, as shown in FIG. 26, in the case where there is considerable variation in the distribution graph of the ESD current paths P14, P14a, and P14b and/or there is a small amount of ESD current path data, a correlation equation E5 may be prepared in stead of the correlation equation E4 calculated using the least-squares method so that ESD withstand voltages of varied widths decrease to a voltage at approximately half the standard deviation. This means that providing a sufficient margin for ESD withstand voltages allows testing of low ESD withstand voltages.

According to the first embodiment, a fast and accurate ESD testing method for a semiconductor device may be provided.

Second Embodiment

Figure 27:
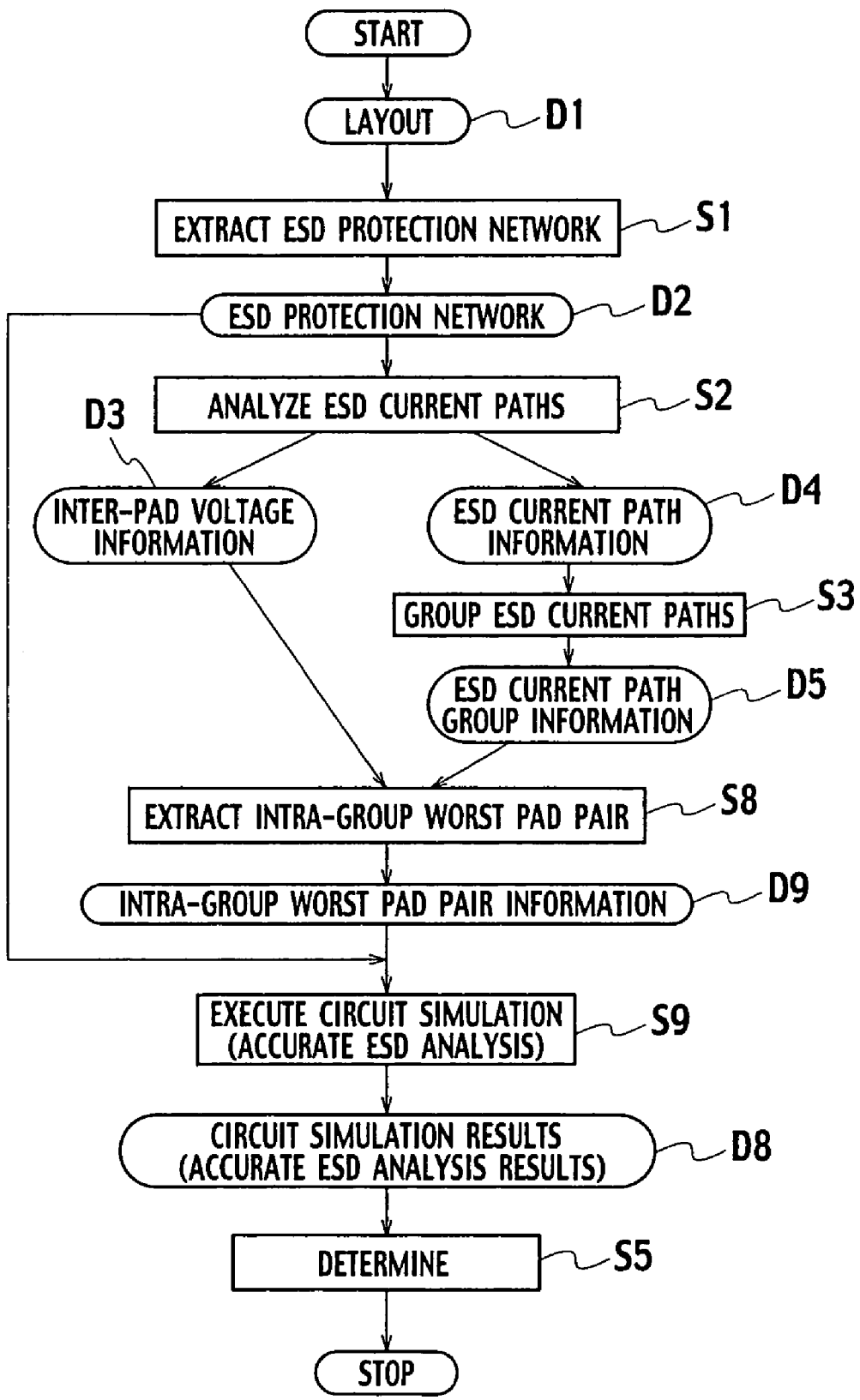
FIG. 27 is a flowchart according to an ESD testing method of a second embodiment.

An ESD testing method according to the second embodiment may be implemented by the ESD testing/prevention apparatus of FIG. 1. As shown in FIG. 27, processing in steps S1 through S3, according to the ESD testing method of the second embodiment, is the same as that of the first embodiment shown in FIG. 2. With the ESD testing method of the second embodiment, after the step S3, processing in step S8 is carried out.

Figure 28A:
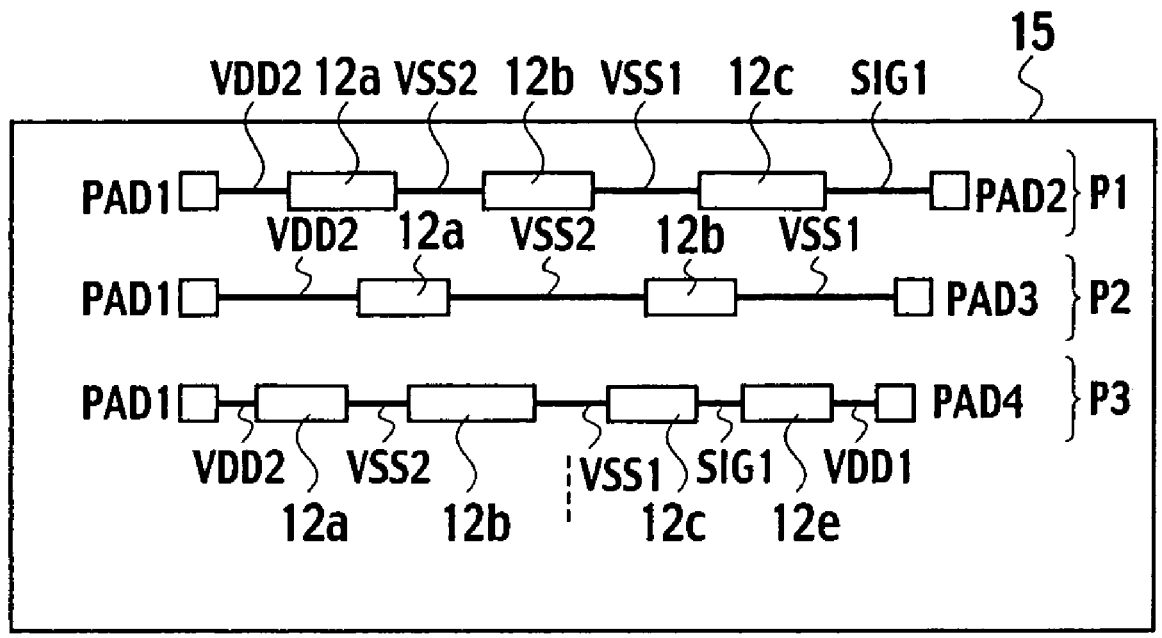
FIG. 28A shows an ESD current path information set for an ESD testing target semiconductor device.
Figure 28B:
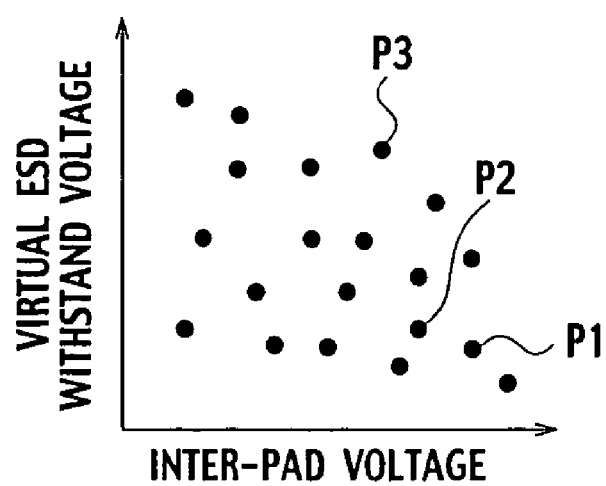
FIG. 28B is a virtual graph of ESD withstand voltages (virtual values) vs. inter-pad voltages (calculated values)

Furthermore, the ESD testing method according to the second embodiment differs from that according to the first embodiment in that the inter-pad voltage/ESD withstand voltage correlation information D7 is not needed. This is because the ESD current path set 15, generated in the step S2 as shown in FIG. 28A, is the same as that of FIG. 7. However, as shown in FIG. 28B, ESD withstand voltages are not directly used in ESD testing. Instead, virtual ESD withstand voltages may be used for the Y-axis in a distribution graph for ESD current paths with inter-pad voltages on the X-axis and ESD voltages on the Y-axis. In other words, since finding a negative correlation between inter-pad voltages and corresponding ESD withstand voltages is easier through grouping, even if ESD withstand voltages are not directly determined, indirect determination of the ESD withstand voltages is possible by determining the inter-pad voltages.

Figure 29A:
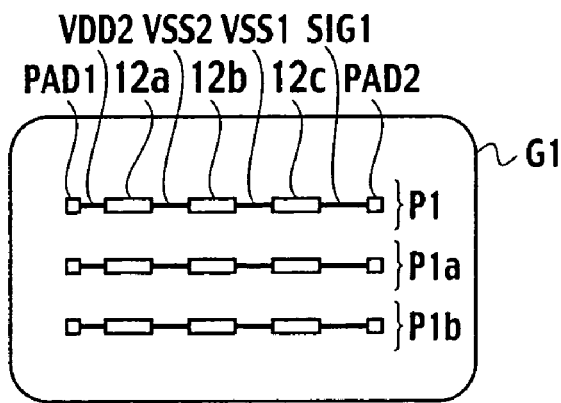
FIG. 29A shows a structure of the group G1 for the ESD testing target semiconductor device.
Figure 29B:
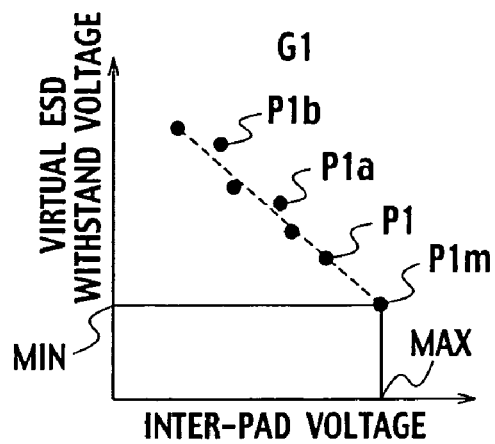
FIG. 29B is a virtual graph of ESD withstand voltages (virtual values) vs. inter-pad voltages (calculated values) for the group G1.
Figure 30A:
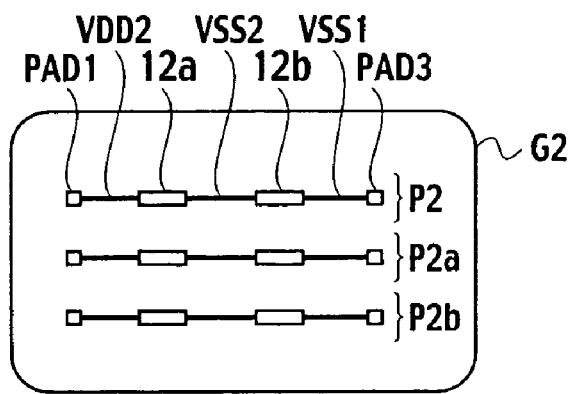
FIG. 30A shows a structure of the group G2 for the ESD testing target semiconductor device.
Figure 30B:
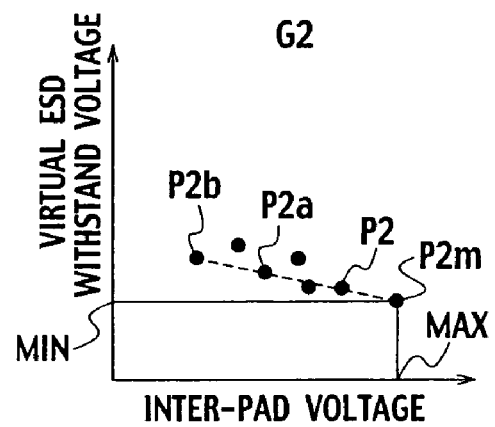
FIG. 30B is a virtual graph of ESD withstand voltages (virtual values) vs. inter-pad voltages (calculated values) for the group G2.
Figure 31A:
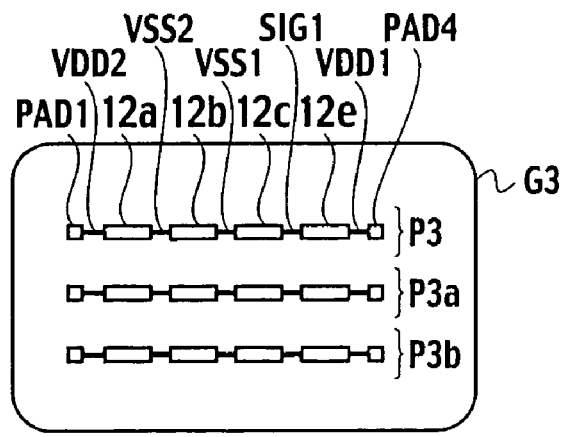
FIG. 31A shows a structure of the group G3 for the ESD testing target semiconductor device.
Figure 31B:
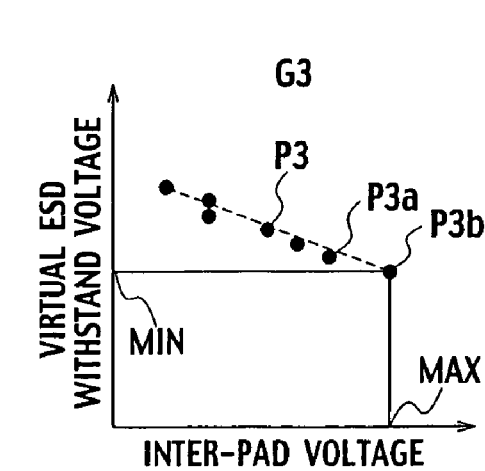
FIG. 31B is a virtual graph of ESD withstand voltages (virtual values) vs. inter-pad voltages (calculated values) for the group G3.

Similarly, the ESD current path groups G1 through G3 generated in the step S3, as shown in FIGS. 29A, 30A, and 31A, are the same as those of FIGS. 10 through 12. However, as shown in FIGS. 29B, 30B, and 31B, ESD withstand voltages are not directly used in ESD testing. Instead, virtual ESD withstand voltages may be used for the Y-axis in a distribution graph for ESD current paths with inter-pad voltages on the X-axis and ESD voltages on the Y-axis for each of respective ESD current path groups G1 through G3. In other words, since the ESD current paths P1 through P3 of each of the respective ESD current path groups G1 through G3 have a negative correlation between inter-pad voltages and corresponding ESD withstand voltages, even if the ESD withstand voltages are not directly determined, the ESD withstand voltages may be indirectly determined through determination of inter-pad voltages, particularly maximum values of the inter-pad voltages.

In step S8, the worst pad pair extracting unit 6 extracts ESD current paths P1m, P2m, and P3b having the highest inter-pad voltages in the inter-pad voltage information D3, for each of respective groups G1 through G3 in the ESD current path group information D5. More specifically, as shown in FIG. 29B, ESD current paths P1, P1a and P1b in the ESD current path group G1 are sorted by inter-pad voltage in decreasing order so as to find a paired start pad and end pad having the highest inter-pad voltage along the ESD current path P1m, thereby generating the intra-group worst pad pair information D9. As shown in FIG. 30B, ESD current paths P2, P2a and P2b in the ESD current path group G2 are sorted by inter-pad voltage in descending order so as to find a paired start pad and end pad having the highest inter-pad voltage along the ESD current path P2m, thereby generating the intra-group worst pad pair information D9. As shown in FIG. 31B, ESD current paths P3, P3a and P3b in the ESD current path group G3 are sorted by inter-pad voltage in decreasing order so as to find a paired start pad and end pad having the highest inter-pad voltage along the ESD current path P3b, thereby generating the intra-group worst pad pair information D9.

In step S9, the circuit simulator 7 executes circuit simulation using the ESD protection network D2 for the ESD current paths P1m, P2m, and P3b with the highest inter-pad voltages, so as to find once again, with high accuracy, the inter-pad voltage between the paired start pad and end pad along each of the ESD current paths P1m, P2m, and P3b. These accurate inter-pad voltages are stored as the circuit simulation results D8.

In step S5, the determination unit 9 determines whether the semiconductor device layout passes the ESD testing, based on the highly accurate inter-pad voltages. More specifically, if the worst paired pads in the ESD current path groups G1 through G3 pass the ESD testing, all paired pads belonging to the groups G1 through G3 may be determined to pass the test. Furthermore, the fail result for ESD between all paired pads in the semiconductor device is basically impermissible. Thus, When the worst paired pads in the ESD current path groups G1 through G3 fail, that semiconductor device should be determined to fail the test.

As such, circuit simulation should be executed for a part of the worst paired pads, allowing accurate ESD testing within a practical time duration. According to the second embodiment, a fast and accurate ESD testing method for a semiconductor device may be provided.

Third Embodiment

Figure 32:
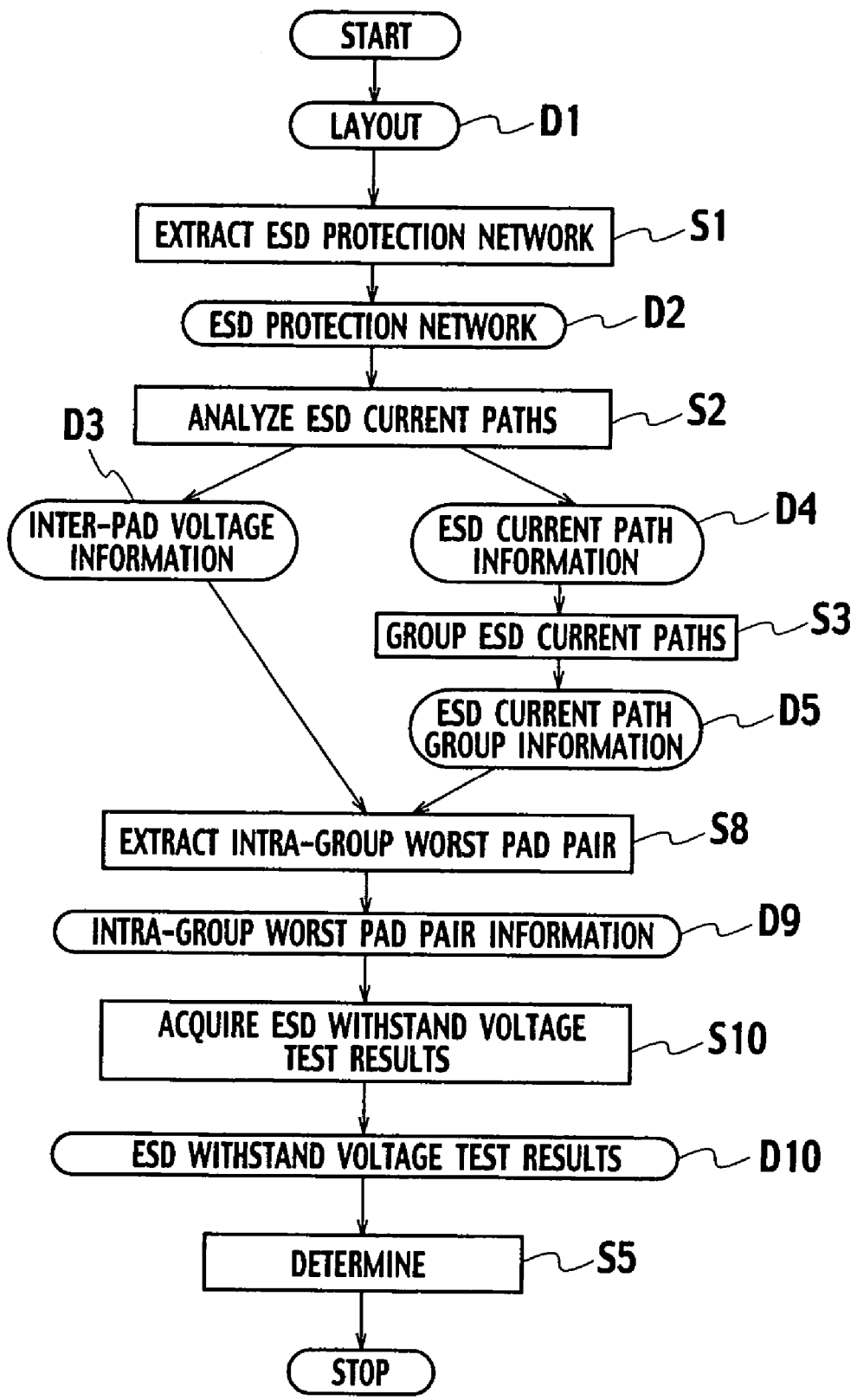
FIG. 32 is a flowchart according to an ESD testing method of a third embodiment.

An ESD testing method according to the third embodiment may be implemented by the ESD testing/prevention apparatus of FIG. 1. As shown in FIG. 32, processing in steps S1 through step S3 and S8, according to the ESD testing method of the third embodiment, is the same as that of the second embodiment shown in FIG. 27. With the ESD testing method of the third embodiment, after the step S8, processing step S10 is carried out. Since processing according to the ESD testing method of the third embodiment also includes the step S8, measurement of ESD withstand voltages that correspond to all respective ESD current paths is unnecessary.

Up until the step S8, ESD withstand voltage testing is carried out for the paired start pad and end pad having the highest inter-pad voltage along each of the ESD current paths P1$m$, P2$m$, and P3$b$ in each of the ESD current path groups G1 through G3, finding actual measurements of ESD withstand voltages.

In step S10, the ESD withstand voltage test results acquisition unit 8 acquires and stores, as ESD withstand voltage test results D10, actual measurements of ESD withstand voltages for the paired start pad and end pad with the highest inter-pad voltage, along each of the ESD current paths P1$m$, P2$m$, and P3$b$.

In step S5, the determination unit 9 determines whether the semiconductor device layout passes the ESD testing, based on the actual measurements of ESD withstand voltages. The determination is carried out in the same manner as with the second embodiment.

As such, execution of ESD testing for only a part of the worst paired pads allows efficient ESD testing. According to the third embodiment, a fast and accurate ESD testing method for a semiconductor device may be provided.

Fourth Embodiment

Figure 33:
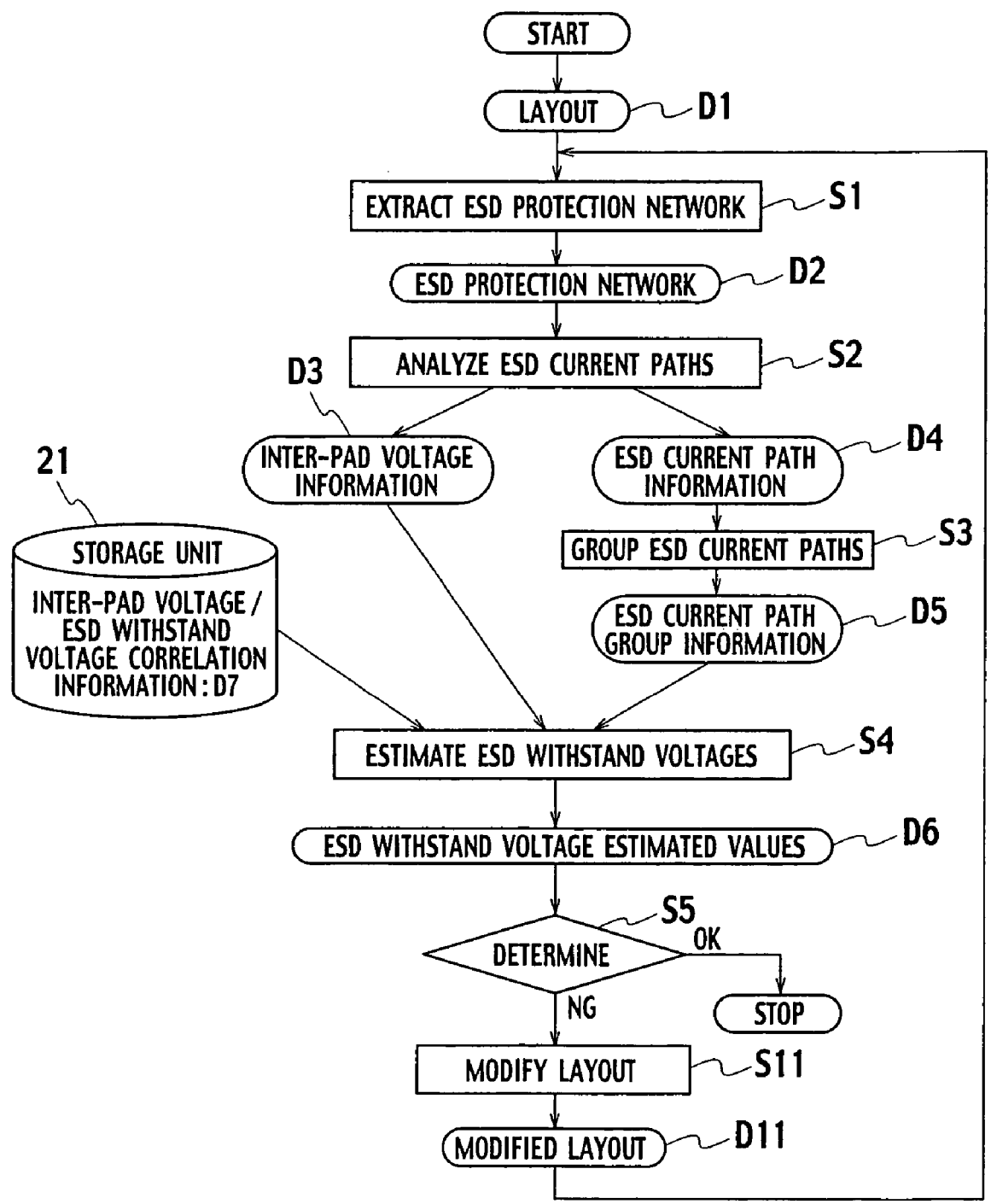
FIG. 33 is a flowchart according to an ESD prevention method of a fourth embodiment.

An ESD testing method according to the fourth embodiment may be implemented by the ESD testing/prevention apparatus of FIG. 1. As shown in FIG. 33, processing in steps S1 through S5, according to the ESD testing method of the fourth embodiment, is the same as that of the first embodiment shown in FIG. 2. With the ESD testing method of the fourth embodiment, after the step S5, processing in step S11 is carried out. After the step S11, processing in the step S1 is carried out, as a loop processing. Furthermore, in the step S5, a determination is made as to whether the semiconductor device layout passes the ESD testing. If the layout passes the test, processing according to the ESD testing method stops. Otherwise, processing proceeds to the step S11.

In the step S11, the layout modification unit 10 modifies the layout of the semiconductor device, and then processing proceeds to the step S1. Furthermore, in the step S5, the loop processing repeats until the semiconductor device layout passes the ESD testing. This procedure generates a semiconductor device layout that passes the ESD testing. Furthermore, ESD for the semiconductor device may be prevented.

Figure 34:
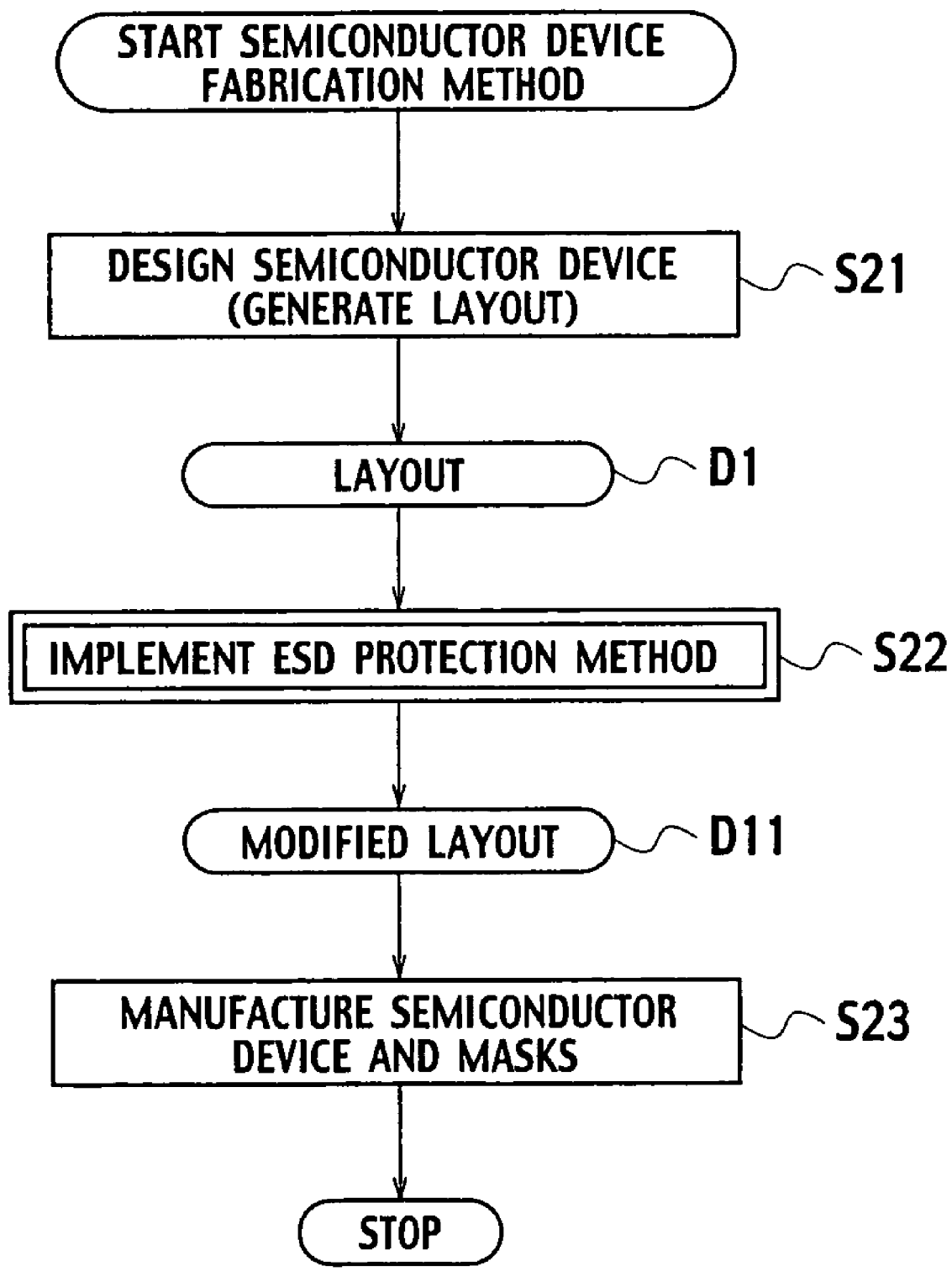
FIG. 34 is a flowchart according to a semiconductor device fabrication method of the fourth embodiment.

As shown in FIG. 34, the semiconductor device fabrication method according to the fourth embodiment includes designing the semiconductor device in step S21 and then generating a layout D1 for the semiconductor device. In step S22, the ESD testing method of FIG. 33 is implemented, generating a modified layout D11. Finally, masks are fabricated, based on the modified layout D11, and the semiconductor device is manufactured, based on these masks.

According to the fourth embodiment, a fast and accurate ESD testing method for a semiconductor device may be provided. According to the fourth embodiment, a semiconductor device ESD testing method, capable of fast and accurate ESD testing of a semiconductor device, may be provided.

Fifth Embodiment

Figure 35:
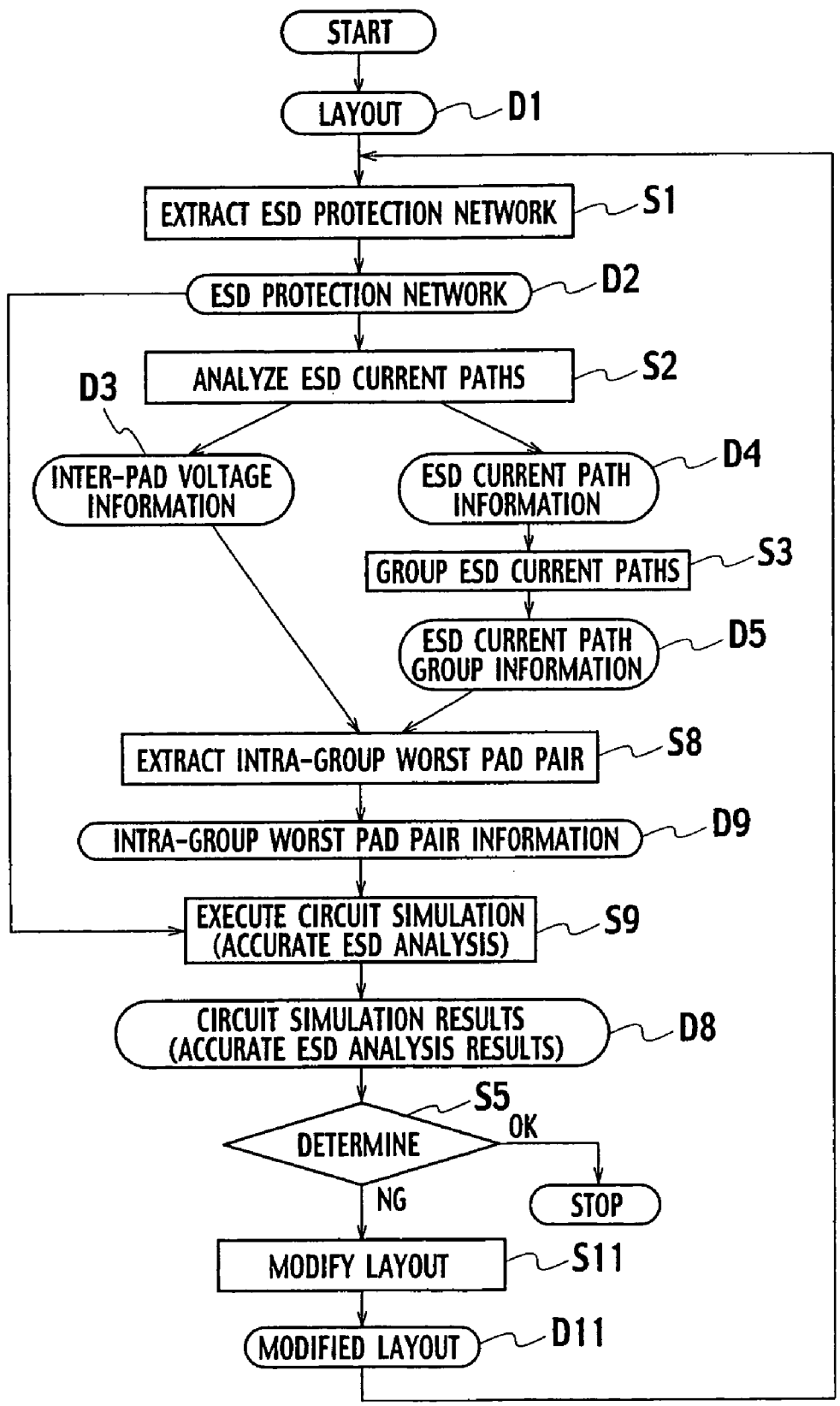
FIG. 35 is a flowchart according to an ESD prevention method of a fifth embodiment.

An ESD testing method according to the fifth embodiment may be implemented by the ESD testing/prevention apparatus of FIG. 1. As shown in FIG. 35, processing in steps S1 through S5, according to the ESD testing method of the fifth embodiment, is the same as that of the second embodiment shown in FIG. 27. With the ESD testing method of the fifth embodiment, after the step S5, processing in step S11 is carried out. After the step S11, processing in the step S1 is carried out, as loop processing. In the step S5, whether the semiconductor device layout passes the ESD testing is determined, and if the layout passes the test, processing according to the ESD testing method stops. Otherwise if the layout fails the test, processing proceeds to the step S11. In the step S11, the layout modification unit 10 modifies the layout of the semiconductor device in the same manner as with the fourth embodiment. Furthermore, implementing processing in step S22 of FIG. 34, according to the ESD testing method of the fifth embodiment, allows fabrication of the semiconductor device.

According to the fifth embodiment, a fast and accurate ESD testing method for a semiconductor device may be provided. According to the fifth embodiment, a semiconductor device ESD testing method capable of fast and accurate ESD testing for a semiconductor device may be provided.

Sixth Embodiment

Figure 36:
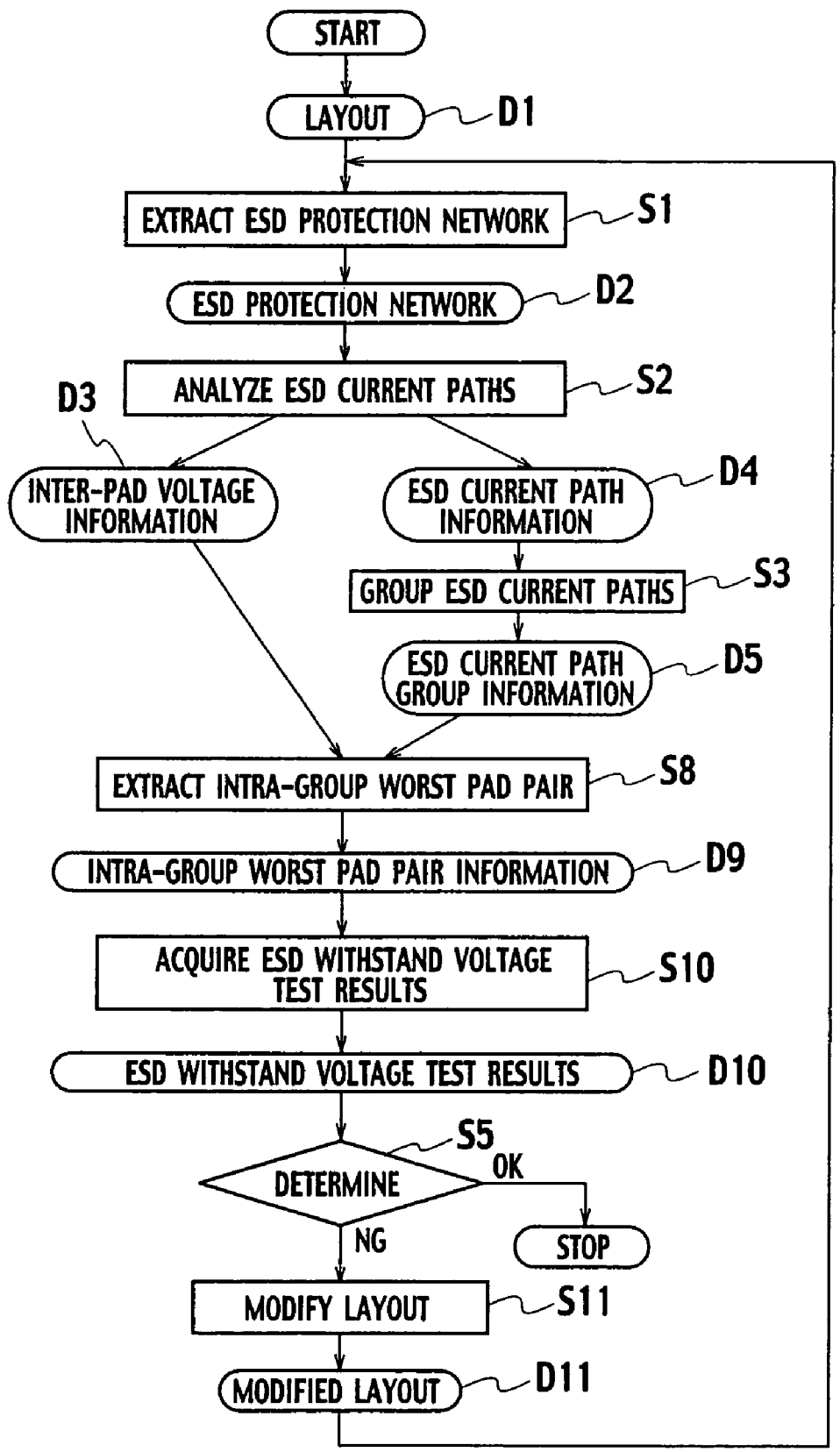
FIG. 36 is a flowchart according to an ESD prevention method of a sixth embodiment.

An ESD testing method according to the sixth embodiment may be implemented by the ESD testing/prevention apparatus of FIG. 1. As shown in FIG. 36, processing in steps S1 through S5 according to the ESD testing method of the sixth embodiment is the same as that of the third embodiment shown in FIG. 32. With the ESD testing method of the sixth embodiment, after the step S5, processing in step S11 is carried out. After the step S11, processing in the step S1 is carried out, loop processing. In the step S5, whether the semiconductor device layout passes the ESD testing is determined, and if the layout passes the test, processing according to the ESD testing method stops. Otherwise if the layout fails the test, processing proceeds to the step S11. In the step S11, the layout modification unit 10 modifies the layout of the semiconductor device in the same manner as with the fourth embodiment. Furthermore, implementing processing in step S22 of FIG. 34, according to the ESD testing method of the sixth embodiment, allows fabrication of a semiconductor device.

According to the sixth embodiment, a fast and accurate ESD testing method for a semiconductor device may be provided. According to the sixth embodiment, a semiconductor device ESD testing method capable of fast and accurate ESD testing for a semiconductor device may be provided.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A method for determining a layout which passes testing for electrostatic discharge in a semiconductor device, comprising:

extracting an electrostatic discharge protection network comprising pads, nets and protective elements from the layout of the semiconductor device;

setting start pads and end pads from the pads in the electrostatic discharge protection network;

detecting inter-pad voltages between the start pads and the end pads and electrostatic discharge current paths along which the nets and the protective elements are arranged in a sequential order from the start pads to the end pads;

grouping, via a grouping process, the electrostatic discharge current paths along with the nets and the protective elements arranged in the sequential order of the detecting the inter-pad voltages step, wherein the grouping process includes grouping the electrostatic discharge current paths as a function of corresponding sequential order of names of elements in the one electrostatic discharge current oath including one or more of names for I/O cells connected to pads, net names, protective element names, or names for I/O cells to which protective elements belong;

calculating estimated values of electrostatic discharge withstand voltages between the start pads and the end pads, based on the inter-pad voltages between the start pads and the end pads and groups to which the start pads and the end pads belong, using a negative correlation between the inter-pad voltages and corresponding electrostatic withstand voltages for each group; and providing a result indicating determination of whether the layout passes testing for electrostatic discharge, based on the estimated values.

2. The method of claim 1, wherein the grouping process groups electrostatic discharge current paths having the same names for I/O cells connected to the start pads.

3. The method of claim 1, wherein the grouping process groups electrostatic discharge current paths having the same names for I/O cells connected to the end pads.

4. The method of claim 1, wherein the grouping process groups electrostatic discharge current paths having the same names for I/O cells to which the protective elements belong.

5. The method of claim 1, further comprising: modifying the layout when the layout fails the electrostatic discharge test.

6. The method of claim 5, further comprising: manufacturing the semiconductor device, based on the modified layout.

7. The method of claim 6, wherein the grouping process groups electrostatic discharge current paths having the same names for I/O cells connected to the start pads.

8. The method of claim 5, wherein the grouping process groups electrostatic discharge current paths having the same names for I/O cells connected to the start pads.

9. The method of claim 5, wherein the grouping process groups electrostatic discharge current paths having the same names for I/O cells connected to the end pads.

10. The method of claim 5, wherein the grouping process groups electrostatic discharge current paths having the same names for I/O cells to which the protective elements belong.

11. A method for determining a layout which passes testing for electrostatic discharge in a semiconductor device, comprising:

extracting an electrostatic discharge protection network comprising pads, nets and protective elements from the layout of the semiconductor device;

setting start pads and end pads from the pads in the electrostatic discharge protection network;

detecting inter-pad voltages between the start pads and the end pads and electrostatic discharge current paths along which the nets and the protective elements are arranged in sequential order from the start pads to the end pads;

grouping, via a grouping process, the electrostatic discharge current paths along with the nets and the protective elements arranged the sequential order of the detecting the inter-pad voltages step, wherein the grouping process includes grouping the electrostatic discharge current paths as a function of corresponding sequential order of names of elements in the one electrostatic discharge current path including one or more of names for I/O cells connected to pads, net names, protective element names, or names for I/O cells to which protective elements belong;

calculating estimated values of electrostatic discharge withstand voltages between the start pads and the end pads, based on the inter-pad voltages between the start pads and the end pads and groups to which the start pads and the end pads belong, via a comparison of the electrostatic discharge withstand voltages with a threshold value; and providing a result indicating determination of whether the layout passes testing for electrostatic discharge, based on the estimated values.

12. The method of claim 11, wherein the grouping process groups electrostatic discharge current paths having the same names for I/O cells connected to the start pads.

13. The method of claim 11, wherein the grouping process groups electrostatic discharge current paths having the same names for I/O cells connected to the end pads.

14. The method of claim 11, wherein the grouping process groups electrostatic discharge current paths having the same names for I/O cells to which the protective elements belong.

15. The method of claim 11, further comprising: modifying the layout when the layout fails the electrostatic discharge test.

16. The method of claim 15, further comprising: manufacturing the semiconductor device, based on the modified layout.

17. The method of claim 16, wherein the grouping process groups electrostatic discharge current paths having the same names for I/O cells connected to the start pads.

18. The method of claim 15, wherein the grouping process groups electrostatic discharge current paths having the same names for I/O cells connected to the start pads.

19. The method of claim 15, wherein the grouping process groups electrostatic discharge current paths having the same names for I/O cells connected to the end pads.

20. The method of claim 15, wherein the grouping process groups electrostatic discharge current paths having the same names for I/O cells to which the protective elements belong.

* * * * *